United States Patent
Adachi et al.

(10) Patent No.: US 9,983,421 B2
(45) Date of Patent: May 29, 2018

(54) COMPONENT MOUNTING LINE AND COMPONENT MOUNTING METHOD

(71) Applicant: Panasonic Intellectual Property Management Co., Ltd., Osaka (JP)

(72) Inventors: Satoshi Adachi, Yamanashi (JP); Shinjiro Tsuji, Yamanashi (JP); Nobuyuki Kakita, Yamanashi (JP); Shingo Yamada, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 382 days.

(21) Appl. No.: 14/958,338

(22) Filed: Dec. 3, 2015

(65) Prior Publication Data
US 2016/0286664 A1 Sep. 29, 2016

(30) Foreign Application Priority Data

Mar. 27, 2015 (JP) .................. 2015-065866

(51) Int. Cl.
*H05K 3/32* (2006.01)
*G02F 1/13* (2006.01)
*H05K 13/04* (2006.01)
*G02F 1/1345* (2006.01)

(52) U.S. Cl.
CPC ....... *G02F 1/1303* (2013.01); *H05K 13/0495* (2013.01); *G02F 1/13452* (2013.01); *H05K 3/323* (2013.01); *Y10T 29/53187* (2015.01)

(58) Field of Classification Search
CPC ..... H01L 24/79; H01L 24/86; H01L 2224/79; H01L 2224/86; H05K 3/323; H05K 3/325; H05K 3/0495; H05K 2203/0278; Y10T 29/53174; Y10T 29/53183; Y10T 29/53187; Y10T 29/53252; G02F 1/1303
See application file for complete search history.

(56) References Cited

U.S. PATENT DOCUMENTS

| | | | | |
|---|---|---|---|---|
| 7,220,922 B2* | 5/2007 | Nishino | ............... | G02F 1/13452 174/260 |
| 2010/0243153 A1* | 9/2010 | Onitsuka | ................. | H01L 24/79 156/290 |
| 2011/0186235 A1* | 8/2011 | Muraoka | ............... | B65H 37/002 156/538 |

FOREIGN PATENT DOCUMENTS

JP   2006-135082 A   5/2006

* cited by examiner

*Primary Examiner* — Peter DungBa Vo
*Assistant Examiner* — Joshua D Anderson
(74) *Attorney, Agent, or Firm* — Pearne & Gordon LLP

(57) ABSTRACT

A component mounting line includes a first and a second component mounting devices. The first component mounting device adheres anisotropic conductive members to a region of a part of one side and a region of the other side of the substrate, temporarily crimps electronic components onto the region of the part of the one side and the region of the other side to which the anisotropic conductive members are adhered, and mainly crimps the electronic components onto the region of the other side. The second component mounting device adheres the anisotropic conductive members to remaining regions of the one side of the substrate, temporarily crimps the electronic components onto the remaining regions of the one side to which the anisotropic conductive members are adhered, and mainly crimps the electronic components onto the region of the part of the one side and the remaining regions of the one side.

8 Claims, 8 Drawing Sheets

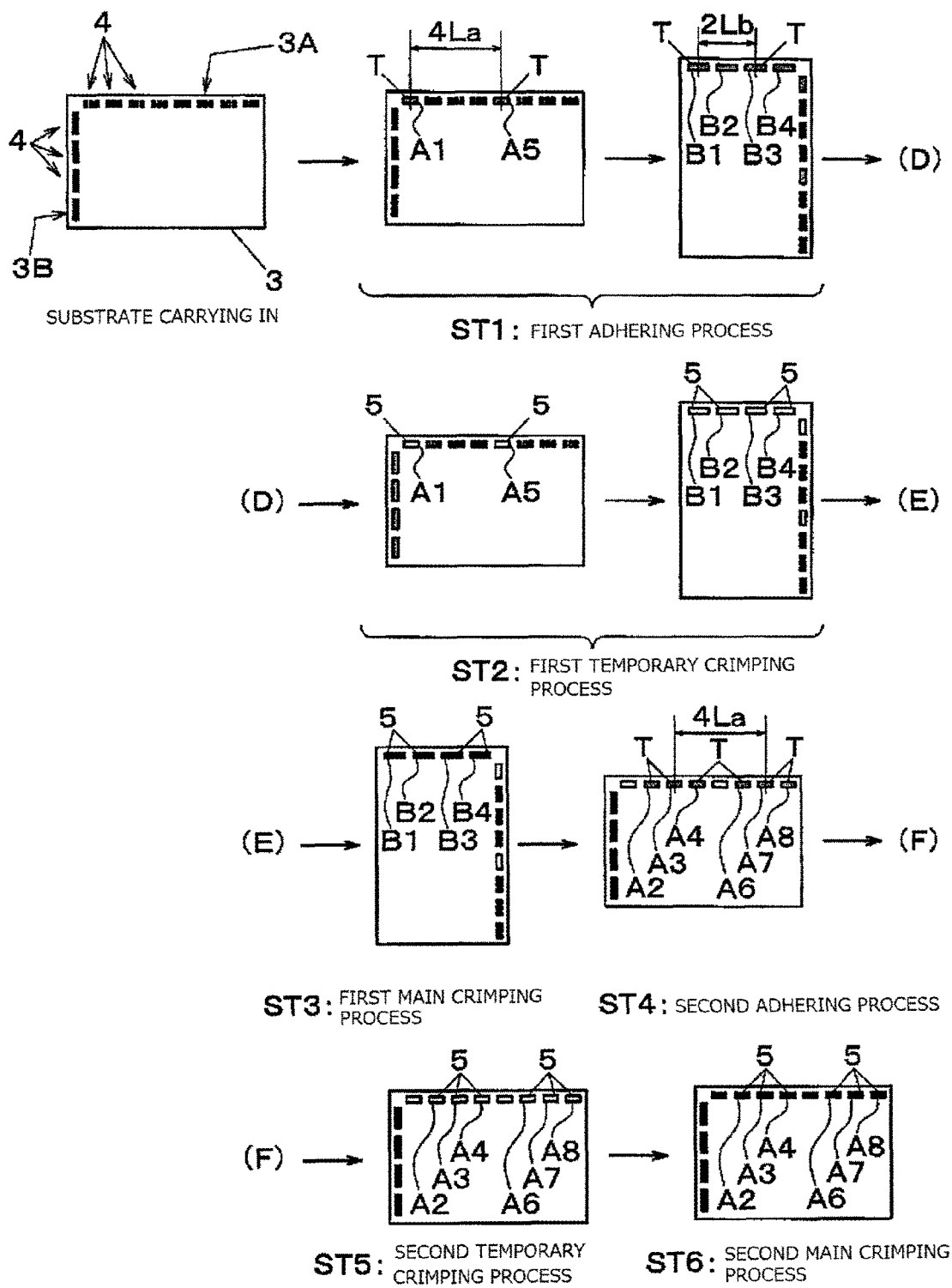

COMPONENT MOUNTING LINE AND COMPONENT MOUNTING METHOD

CROSS-REFERENCES TO RELATED APPLICATION(S)

This application is based on and claims priority from Japanese Patent Application No. 2015-065866 filed on Mar. 27, 2015, the entire contents of which are incorporated herein by reference.

BACKGROUND

1. Field of the Invention

One or more embodiments of the present invention relate to a component mounting line and a component mounting method in which a substrate such as a liquid crystal panel substrate is manufactured by crimping components onto a substrate after the components are mounted on the substrate.

2. Description of Related Art

A component mounting device for manufacturing a liquid crystal panel substrate includes an ACF adhering operation section (adhering section) that adheres an Anisotropic Conductive Film (ACF) tape of an anisotropic conductive member as an adhesive member to an end portion of a substrate, a component mounting operation section (temporary crimping section) that mounts an electronic component (hereinafter, referred to as "component") such as a driving circuit on a portion of the substrate in which the ACF tape is adhered, and a component crimping operation section (main crimping section) that crimps the component onto the substrate, on which the component is mounted, in the component mounting operation section. Furthermore, in the manufacturing of the liquid crystal panel substrate where the components are mounted on adjacent two sides (one side and the other side), component mounting operations are sequentially performed while rotating the substrate by 90 degrees (see below-described Patent Document 1, for instance).

In the component mounting device disclosed in Patent Document 1, two adhering sections, two temporary crimping sections, and two main crimping sections are arranged side by side in this order, and the component mounting operations are performed by rotating the substrate between the two adhering sections by 90 degrees, reversely rotating the substrate between the two temporary crimping sections by 90 degrees, and rotating the substrate between the two main crimping sections by 90 degrees. That is, the component mounting operations are continuously performed in order of adhering the ACF tape to one side of the substrate, adhering the ACF tape to the other side, temporary crimping the component to the other side, temporary crimping the component to the one side, main crimping the component to the one side, and main crimping the component to the other side.

Patent Document 1 is JP-A-2006-135082.

SUMMARY

However, in the component mounting device of Patent Document 1, when manufacturing the substrate having two sides on which the number of the components to be mounted is greatly different, a cycle time of the component mounting operation is determined by an operation time of the side on which a large number of the components are mounted and each operation section of the component mounting device may not by effectively utilized. For example, when manufacturing the substrate where eight components are mounted on a long side and four components are mounted on a short side, since the cycle time is determined by the operation time of mounting of the components on the long side, the substrate cannot be transported until temporary crimping of the components to the long side is completed, each operation section waits for the substrate, and then productivity of the component mounting device is deteriorated.

Thus, an object of the embodiment of the invention is to provide a component mounting line and a component mounting method in which productivity of component mounted substrates can be improved.

According to the embodiments, there is provided a component mounting line that mounts electronic components on a substrate, the component mounting line including: a first component mounting device on an upstream side in a substrate transporting direction in which the substrate is transported; and a second component mounting device that is on a downstream side in the substrate transporting direction and is connected with the first component mounting device, wherein the first component mounting device includes a first adhering section that adheres anisotropic conductive members to a region of a part of one side and a region of the other side of the substrate, a first temporary crimping section that temporarily crimps the electronic components onto the region of the part of the one side and the region of the other side of the substrate to which the anisotropic conductive members are adhered, and a first main crimping section that mainly crimps the electronic components which are temporarily crimped onto the region of the other side, and the second component mounting device includes a second adhering section that adheres the anisotropic conductive members to remaining regions of the one side of the substrate other than the part of the one side, a second temporary crimping section that temporarily crimps the electronic components onto the remaining regions of the one side to which the anisotropic conductive members are adhered, and a second main crimping section that mainly crimps the electronic components which are temporarily crimped onto the region of the part of the one side and the electronic components which are temporarily crimped onto the remaining regions of the one side.

According to the embodiments of the invention, there is provided a component mounting method for mounting electronic components on a substrate in a component mounting line including a first component mounting device on an upstream side in a substrate transporting direction in which the substrate is transported and a second component mounting device that is on a downstream side in the substrate transporting direction and is connected with the first component mounting device, the method including: in the first component mounting device, adhering anisotropic conductive members to a region of a part of one side and a region of the other side of the substrate, temporarily crimping the electronic components onto the region of the part of the one side and the region of the other side to which the anisotropic conductive members are adhered, and mainly crimping the electronic components which are temporarily crimped onto the region of the other side, and in the second component mounting device, adhering the anisotropic conductive members to remaining regions of the one side of the substrate other than the part of the one side, temporarily crimping the electronic components onto the remaining regions of the one side to which the anisotropic conductive members are adhered, and mainly crimping the electronic components which are temporarily crimped onto the region of the part of the one side and the electronic components which are temporarily crimped onto the remaining regions of the one side.

According to the embodiments, it is possible to improve productivity of component mounted substrate.

BRIEF DESCRIPTION OF THE DRAWINGS

FIG. 8 is a diagram illustrating an operation processing situation of the substrate in the component mounting operation by the component mounting line according to the embodiment of the invention.

DETAILED DESCRIPTION

Figure 2:
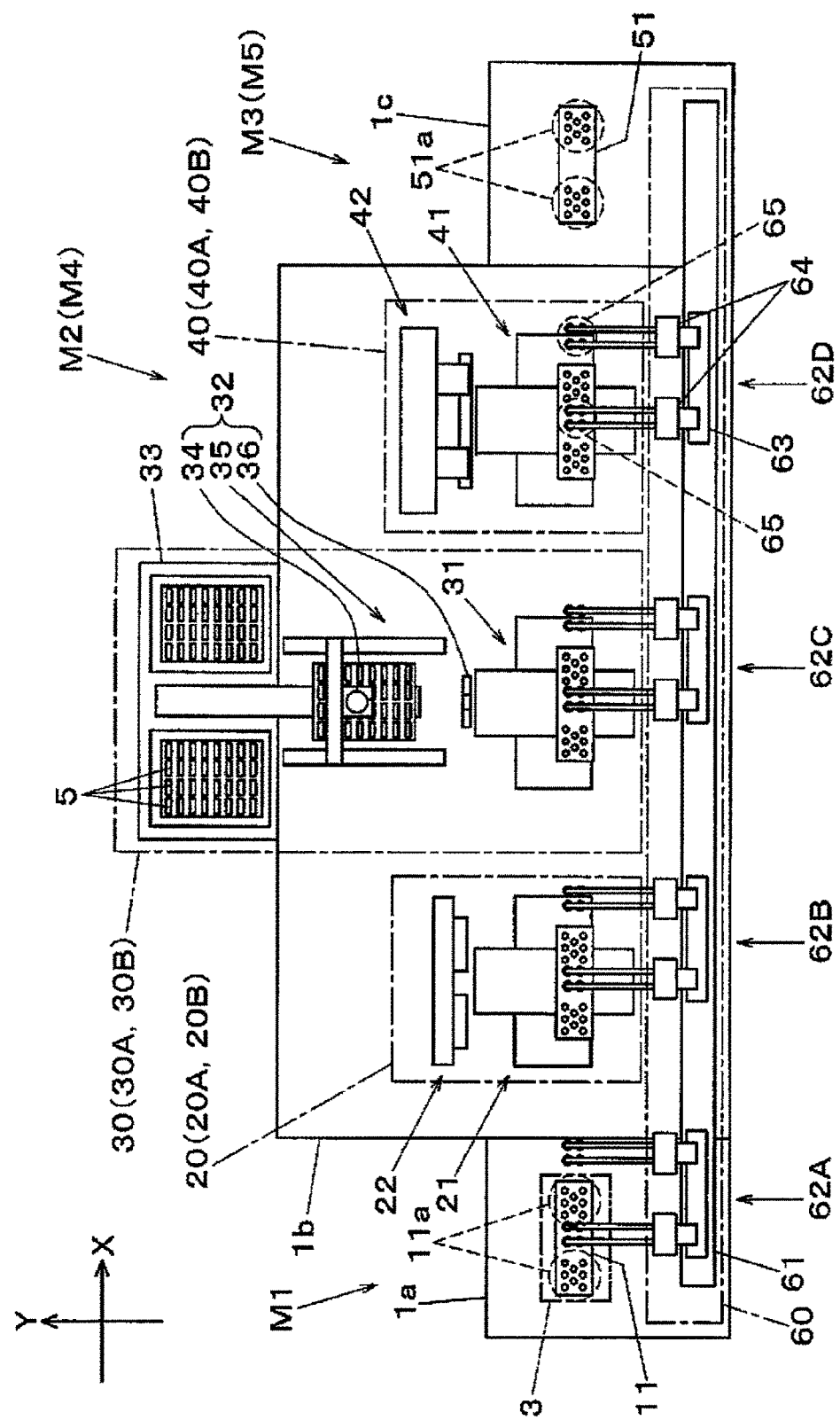
FIG. 2 is a plan view of a component mounting device according to the embodiment of the invention.
Figure 3A:
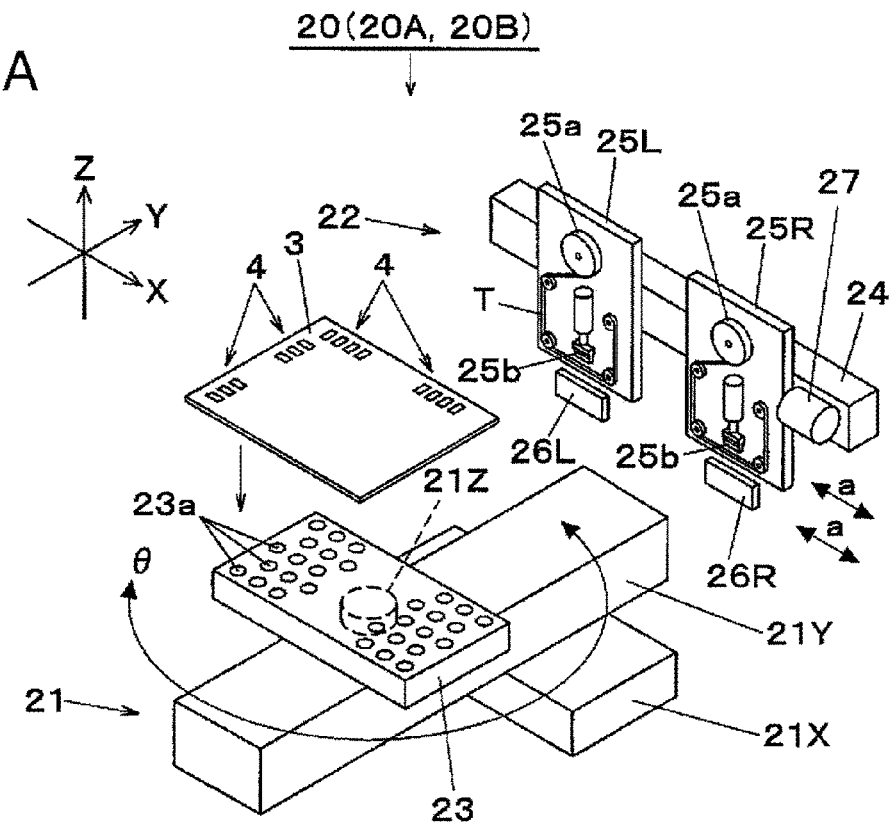
FIGS. 3A and 3B are perspective views of an adhering section according to the embodiment of the invention.
Figure 3B:
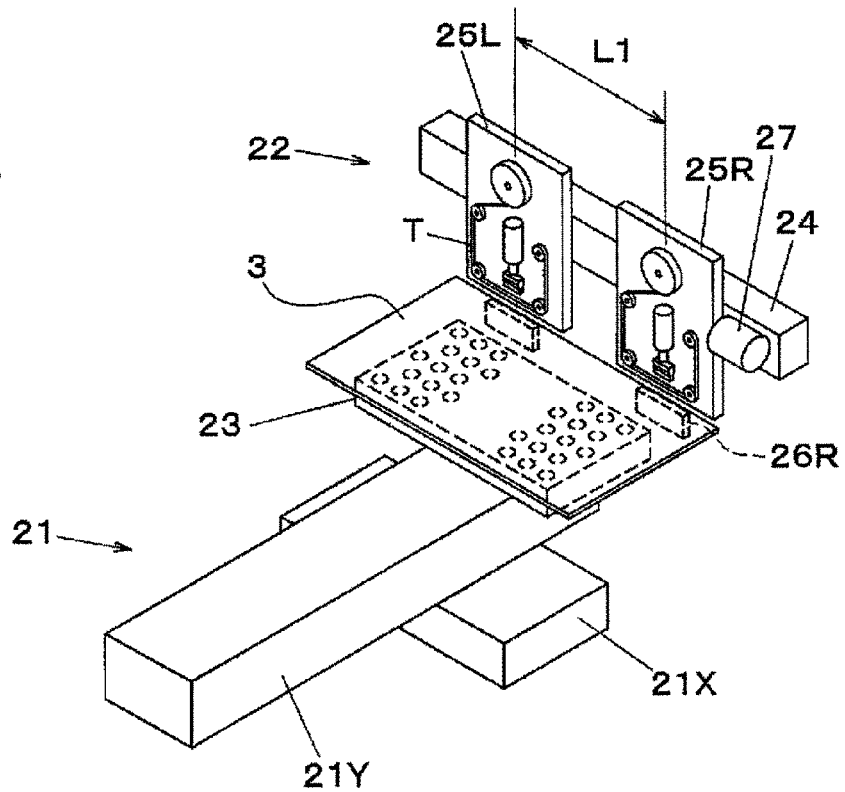

Hereinafter, an embodiment of the invention will be described in detail with reference to the drawings. Configurations, shapes, and the like described below are exemplified for description and may be appropriately changed according to specifications of a component mounting line. Hereinafter, the same reference numerals are given to corresponding elements in all drawings and duplicated description will be omitted. In FIG. 2 and a part of below description, an X-axis direction (right and left direction in FIG. 2) of a substrate transport direction and a Y-axis direction (up and down direction in FIG. 2) orthogonal to the substrate transport direction are illustrated as two axes direction orthogonal to each other within a horizontal plane. In FIGS. 3A and 3B and a part of below description, a Z-axis direction is illustrated as a height direction orthogonal to the horizontal plane. The Z-axis direction is an up and down direction or an orthogonal direction if the component mounting line is disposed on the horizontal plane.

Figure 1:
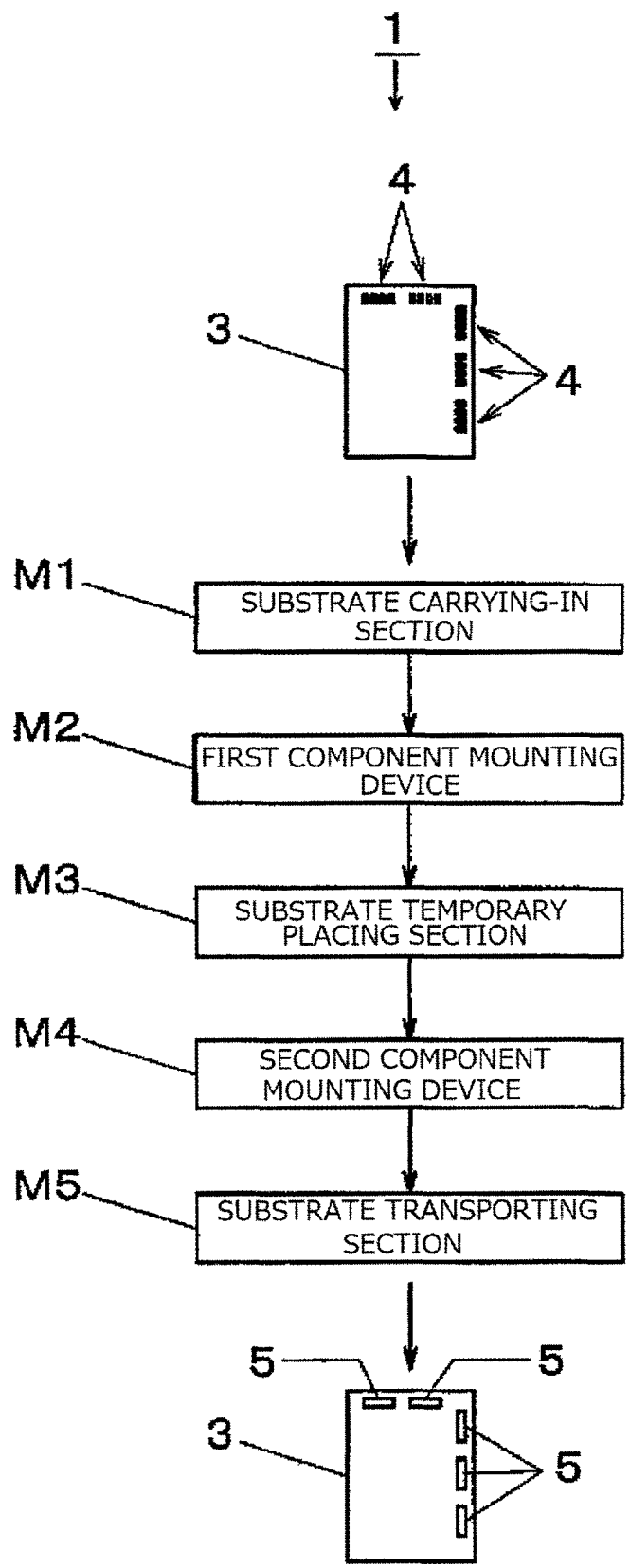
FIG. 1 is a configuration diagram of a component mounting line according to an embodiment of the invention.

In FIG. 1, a component mounting line 1 is configured such that a substrate carrying-in section M1, a first component mounting device M2, a substrate temporary placing section M3, a second component mounting device M4, and a substrate transporting section M5 are connected in this order. The component mounting line 1 performs a component mounting operation for mounting components 5 (electronic components) such as driving circuits on each of a plurality of electrode sections 4 (each electrode section is configured of a plurality of electrodes) provided in end portions of a long side (one side) and a short side (other side) of a rectangular substrate 3 such as a liquid crystal panel substrate that is carried in by the substrate carrying-in section M1 on an upstream side on which the substrate is transported.

Next, configurations of the operation sections and devices M1 to M5 included in the component mounting line 1 will be described with reference to FIGS. 2 to 4. In FIG. 2, the component mounting line 1 is configured such that the substrate carrying-in section M1, the first component mounting device M2, the substrate temporary placing section M3, the second component mounting device M4 (see FIGS. 5 and 7), and the substrate transporting section M5 (see FIGS. 5 and 7) are connected from the upstream side (left side in the view) on which the substrate 3 is transported. That is, the component mounting line 1 is configured such that at least the first component mounting device M2 on the upstream side and the second component mounting device M4 on a downstream side on which the substrate 3 is transported are connected. Moreover, the first component mounting device M2 and the second component mounting device M4 have the same configuration, and details of the second component mounting device M4 will be omitted.

In FIG. 2, a substrate mounting stage 11 is provided in a base stand 1a of the substrate carrying-in section M1. The substrate mounting stage 11 moves up and down with respect to the base stand 1a in the Z-axis direction. Furthermore, a plurality of suction holes 11a are provided on an upper surface of the substrate mounting stage 11 and the substrate 3 mounted on the substrate mounting stage 11, which is carried in by an operator or from another device on the upstream side, is held by vacuum-sucking.

In FIG. 2, the first component mounting device M2 includes an adhering section 20, a temporary crimping section 30, and a main crimping section 40 on a base stand 1b in this order from the upstream side. The adhering section 20 has a function of performing an adhering operation to adhere an ACF tape (anisotropic conductive member) that is an adhesive member to the electrode section 4 of the substrate 3 and includes a substrate moving mechanism 21, and an adhering mechanism 22.

In FIGS. 3A and 3B, an X-axis table 21X, a Y-axis table 21Y, a Z-axis table 21Z, a substrate mounting stage 23 are overlapped and provided on the base stand 1b in the substrate moving mechanism 21 in this order from a lower side. The Y-axis table 21Y is provided so as to extend in the Y-axis direction and freely moves on the X-axis table 21X in the X-axis direction. The Z-axis table 21Z freely moves on the Y-axis table 21Y in the Y-axis direction, moves up and down the substrate mounting stage 23 provided on the upper portion thereof in the Z-axis direction, and is rotated (an arrow θ) around the Z axis. Furthermore, a plurality of suction holes 23a are provided on the upper surface of the substrate mounting stage 23 and holds the substrate 3 mounted on the substrate mounting stage 23 by vacuum-sucking the substrate 3. As described above, the substrate moving mechanism 21 moves the substrate 3 within the horizontal plane (X-Y axis directions) by sucking and holding the substrate 3, moves the substrate 3 in the up and down direction (the Z-axis direction), and rotates the substrate 3 around the Z axis.

In FIGS. 3A and 3B, the adhering mechanism 22 includes two adhering heads 25L and 25R disposed in a front surface of a beam 24 provided so as to extend in the X-axis direction above the base stand 1b side by side in the X-axis direction. Each of the adhering heads 25L and 25R has a tape supply section 25a and an adhering tool 25b. Furthermore, adhering support stands 26L and 26R are respectively provided in corresponding positions below each of the adhering heads 25L and 25R. The adhering head 25R and the adhering support stand 26R on the downstream side are integrally moved in the X-axis direction (arrows a) by a head moving mechanism including a head moving motor 27. Thus, an interval L1 between the two adhering heads 25L and 25R, and the adhering support stands 26L and 26R can be freely changed corresponding to an interval between the electrode sections 4 to which the ACF tape T is adhered.

Adhering of the ACF tape T is performed in a state where the electrode sections 4 of the substrate 3 held by the substrate moving mechanism 21 illustrated in FIG. 3B are positioned below (above the adhering support stands 26L and 26R) the adhering heads 25L and 25R. Each of the adhering heads 25L and 25R cuts the ACF tape T supplied by the tape supply section 25a to match a length of the electrode section 4, positions the cut ACF tape T above the electrode section 4, and lowers the adhering tool 25b. Thus, the ACF tape T is adhered to the substrate 3 that is crimped by the adhering support stands 26L and 26R for each substrate 3.

As described above, a plurality of the adhering heads 25L and 25R (adhering units) adhering the ACF tape T (anisotropic conductive member) are provided in the adhering section 20 (first adhering section) with a predetermined interval L1. The plurality of the adhering heads 25L and 25R are variable and simultaneously adhere the ACF tape T to the plurality of electrode sections 4 (here, two positions) on the substrate 3. Furthermore, the adhering section 20 adheres the ACF tape T to the electrode sections 4 of the long side and the short side of the substrate 3 by rotating a direction of the substrate 3 held by the substrate moving mechanism 21 by 90 degrees. Moreover, the head moving mechanism is not limited to the configuration described above and may freely change the interval L1 by integrally moving the adhering head 25R and the adhering support stand 26R on the downstream side. Furthermore, the adhering head 25L and the adhering support stand 26L on the upstream side may be integrally moved.

In FIG. 2, the temporary crimping section 30 has a function of temporarily crimping the component 5 by mounting the component 5 on a region to which the ACF tape T is adhered and includes a substrate moving mechanism 31, a component mounting mechanism 32, and a component supply section 33. The substrate moving mechanism 31 has the same structure as the substrate moving mechanism 21 of the adhering section 20 described above and has a function of moving the substrate 3 within the horizontal plane (X-Y axis directions) by sucking and holding the substrate 3, moving the substrate 3 in the up and down direction (Z-axis direction), and rotating the substrate 3 around the Z axis. The component supply section 33 is provided behind the component mounting mechanism 32 so as to extend from a rear portion of the base stand 1b and supplies the component 5 to the component mounting mechanism 32.

The component mounting mechanism 32 is provided on the base stand 1b and includes a mounting head 34, a mounting head moving mechanism 35, and a mounting support stand 36. The mounting head 34 is freely moved within the horizontal plane (X-Y axis directions) by the mounting head moving mechanism 35 and sucks (picks up) the component 5 supplied by the component supply section 33 by moving up and down in the Z-axis direction from above. The substrate moving mechanism 31 positions the region of the holding substrate 3 to which the ACF tape T is adhered above the mounting support stand 36, the component mounting mechanism 32 mounts the sucked component 5 on the ACF tape T, and temporarily crimps the substrate 3 by crimping each substrate 3 against the mounting support stand 36. Furthermore, the temporary crimping section 30 temporarily crimps the component 5 onto the long side and the short side of the substrate 3 by rotating the substrate 3 held by the substrate moving mechanism 31 by 90 degrees.

In FIG. 2, the main crimping section 40 has a function of mainly crimping a plurality of components 5 disposed in a line in the substrate 3 and includes a substrate moving mechanism 41, and a crimping mechanism 42. The substrate moving mechanism 41 has the same structure as the substrate moving mechanism 21 of the adhering section 20 described above and has a function of moving the substrate 3 within the horizontal plane (the X-Y axis directions) by sucking and holding the substrate 3, moving the substrate 3 in the up and down direction (the Z-axis direction), and rotating the substrate 3 around the Z-axis direction.

Figure 4:
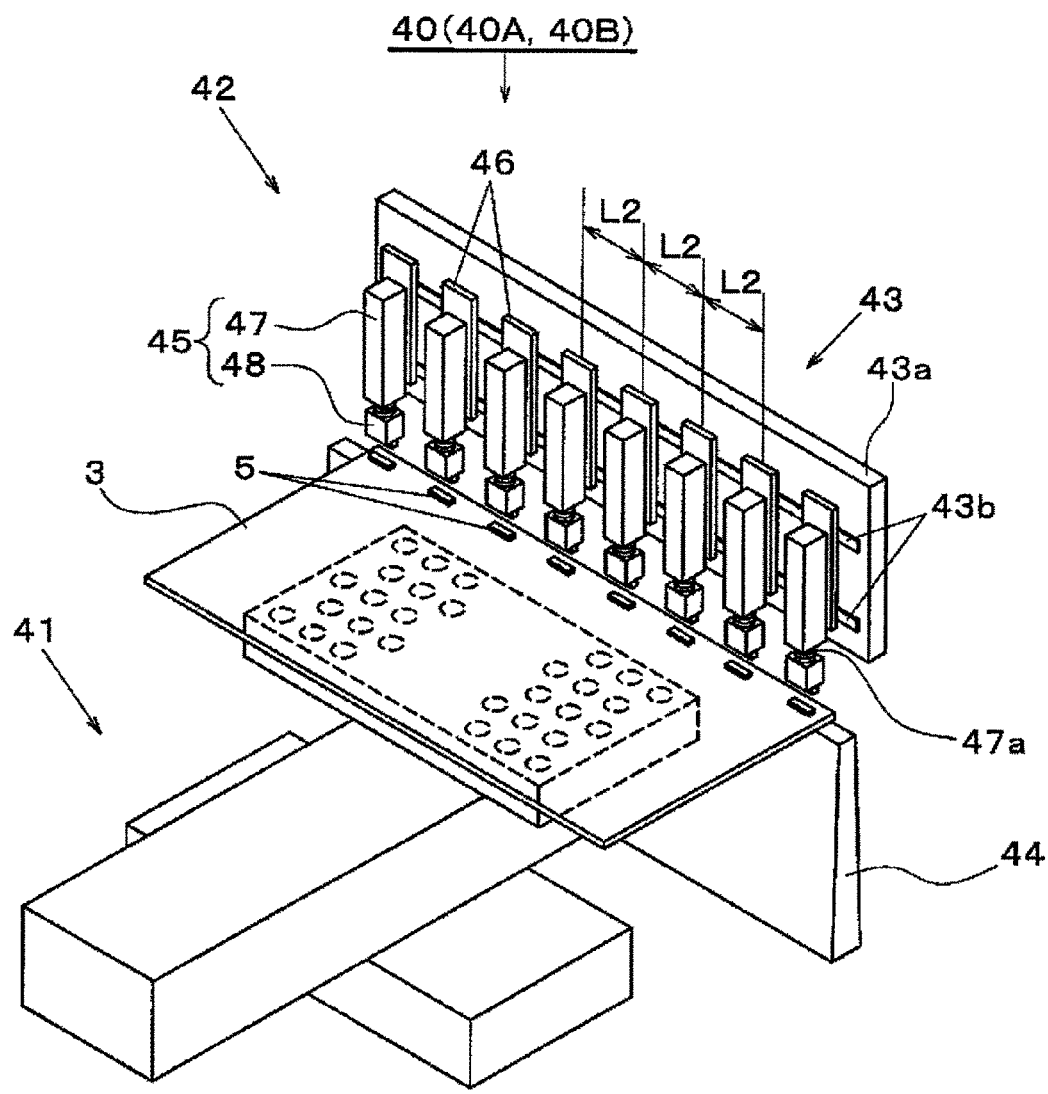
FIG. 4 is a perspective view of a main crimping section according to the embodiment of the invention.
Figure 4:
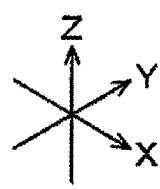

In FIG. 4, the crimping mechanism 42 includes a crimping section 43 and a crimping support section 44. The crimping section 43 is configured to include a plurality of crimping units 45 (eight in the example of FIG. 4) that are adjustable in the X-axis direction with respect to a base section 43a. A pair of guide sections 43b extending in the X-axis direction is provided in the base section 43a. A plurality of rectangular-planar mounting members 46 each of which is disposed in a vertical posture are mounted on the guide section 43b to be adjustable in the X-axis direction.

The crimping unit 45 is configured of a pressurizing mechanism 47 and a crimping head 48. The pressurizing mechanism 47 is mounted on the mounting member 46. The pressurizing mechanism 47 has a rod 47a protruding and retracting in up and down direction and is provided with the crimping head 48 at a lower end portion of the rod 47a. A plurality of crimping heads 48 are disposed in a line above the crimping support section 44. An operator can change intervals L2 between the crimping heads 48 to match the intervals between the components 5 that are temporarily crimped onto the substrate 3 by adjusting the crimping units 45 at desired positions.

The crimping head 48 has a built-in heater and is heated to a predetermined temperature by the heater before crimping the component 5. The crimping head 48 is lowered by driving of the pressurizing mechanism 47 and presses (mainly crimps) the component 5 that is mounted on an edge of the substrate 3 while heating the component 5. In this case, hardening of the ACF tape T is enhanced by heat generated from the crimping head 48. Furthermore, the main crimping section 40 mainly crimps the components 5 that are temporarily crimped onto the long side and the short side of the substrate 3 by rotating the direction of the substrate 3 held by the substrate moving mechanism 41 by 90 degrees. Moreover, the crimping mechanism 42 is not limited to the configuration described above and may be configured such that the number and a shape (length in the X-direction) of the crimping head 48 are provided which can simultaneously and mainly crimp the components 5 temporarily crimped onto each side (long side and the short side) of the substrate 3.

In FIG. 2, a base stand 1c of the substrate temporary placing section M3 is provided with a substrate mounting stage 51. The substrate mounting stage 51 moves up and down with respect to the base stand 1c in the Z-axis direction. Furthermore, a plurality of suction holes 51a are provided in an upper surface of the substrate mounting stage 51 and have functions of holding the substrate 3 transported from the first component mounting device M2 by vacuum-sucking the substrate 3 on the substrate mounting stage 51, and delivering the substrate 3 to the second component mounting device M4. Moreover, the component mounting line 1 may be configured to omit the substrate temporary placing section M3 and to transport the substrate 3 from the main crimping section 40 of the first component mounting device M2 to the adhering section 20 of the second component mounting device M4.

The substrate transporting section M5 has the same structure as that of the substrate temporary placing section M3 and has a function of holding the substrate 3 transported from the second component mounting device M4 by vacuum-sucking the substrate 3 on the substrate mounting stage included in the substrate transporting section M5. The substrate 3 that is held in the substrate transporting section M5 is delivered to another device on the downstream side or is taken out from the substrate mounting stage by the operator.

In FIG. 2, a substrate transporting section 60 having a function of delivering (transporting) the substrate 3 between the operation sections is provided in front regions (lower side in FIG. 2) of the substrate carrying-in section M1, the first component mounting device M2, and the substrate temporary placing section M3. The substrate transporting section 60 includes a first substrate transporting mechanism 62A, a second substrate transporting mechanism 62B, a third substrate transporting mechanism 62C, and a fourth substrate transporting mechanism 62D on a moving base 61 extending in the X-axis direction over the base stands 1a, 1b, and 1c from the upstream side.

In FIG. 2, each of the substrate transporting mechanisms 62A to 62D has a base section 63 and two arm units 64. Each base section 63 is provided on the moving base 61 and freely moves in the X-axis direction. The two arm units 64 are provided on each base section 63 side by side in the X-axis direction. Two arms extending rearward in the horizontal direction are provided in each arm unit 64 side by side in the X-axis direction and a plurality (here, two) of suction pads 65 of which suction surfaces face downward are provided in each arm. Each arm unit 64 vacuum-sucks the substrate 3 from above through total four suction pads 65 provided in two arms.

Each of the substrate transporting mechanisms 62A to 62D moves to a "substrate delivery position" in which the substrate 3 that is held by the substrate mounting stage of each operation section is vacuum-sucked from above and performs receiving and delivering of the substrate 3 from the substrate mounting stage moving up and down. Specifically, the first substrate transporting mechanism 62A receives the substrate 3 from the substrate carrying-in section M1 and delivers the substrate 3 to the adhering section 20 of the first component mounting device M2. The second substrate transporting mechanism 62B receives the substrate 3 from the adhering section 20 and delivers the substrate 3 to the temporary crimping section 30. The third substrate transporting mechanism 62C receives the substrate 3 from the temporary crimping section 30 and delivers the substrate 3 to the main crimping section 40. The fourth substrate transporting mechanism 62D receives the substrate 3 from the main crimping section 40 and delivers the substrate 3 to the substrate temporary placing section M3.

Figure 5:
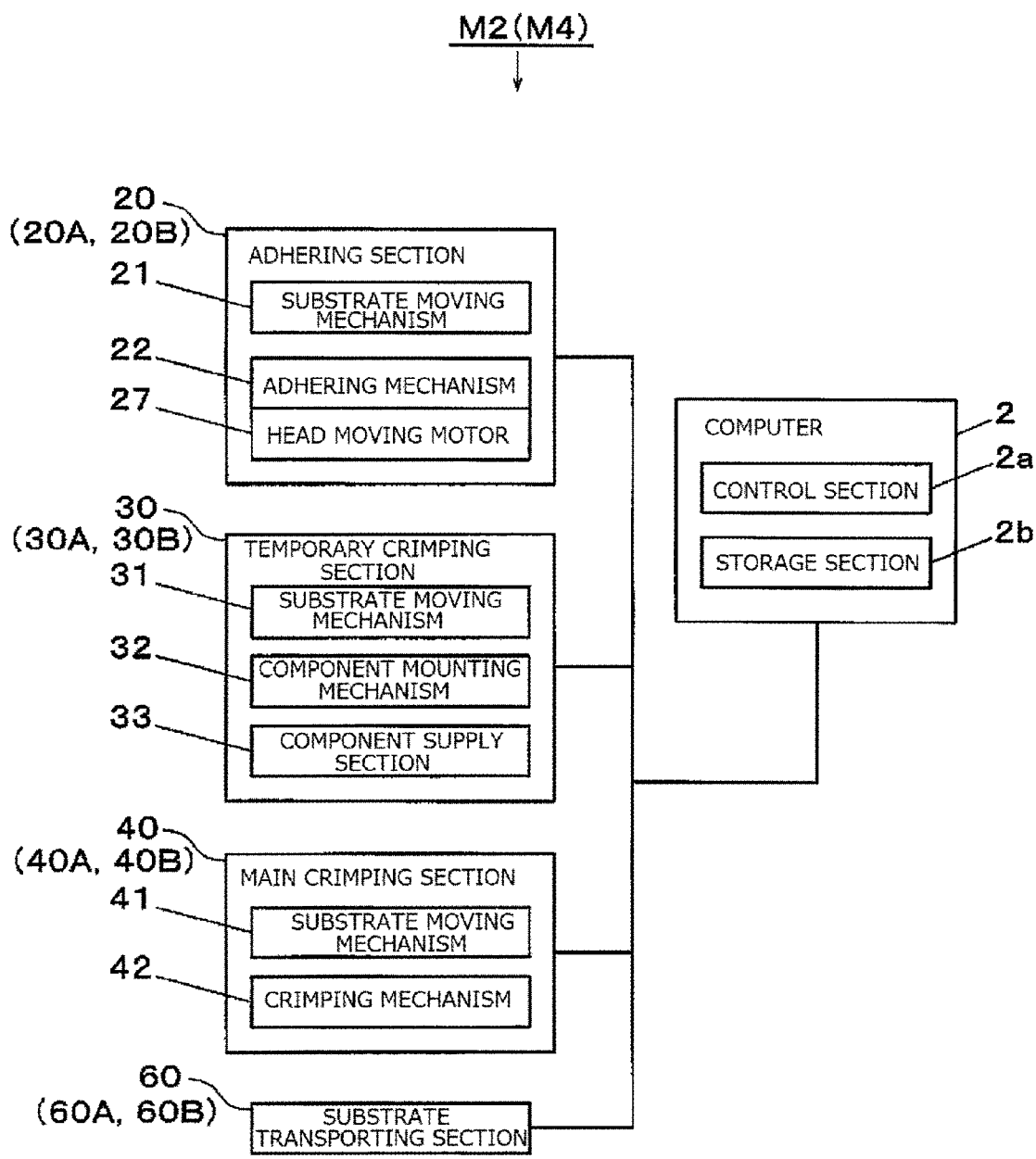
FIG. 5 is a block diagram illustrating a control system of the component mounting device according to the embodiment of the invention.

Next, control systems of the first component mounting device M2 and the second component mounting device M4 will be described with reference to FIG. 5. Here, since the control systems of the first component mounting device M2 and the second component mounting device M4 have the same configuration, the control system of the first component mounting device M2 is described and description of the control system of the second component mounting device M4 will be omitted. A computer 2 provided in the first component mounting device M2 has a control section 2a and a storage section 2b. The storage section 2b stores various items of data necessary for the component mounting operation such as a size of the substrate 3 such as the liquid crystal panel substrate manufactured by the first component mounting device M2, types of the components 5 mounted on the substrate 3, a mounting position (X-Y coordinates), a mounting direction, and timing of transporting of the substrate 3 between the operation sections.

The control section 2a executes the substrate transporting operation for operating the substrate 3 between the operation sections by controlling the substrate moving mechanism 21 of the adhering section 20, the substrate moving mechanism 31 of the temporary crimping section 30, the substrate moving mechanism 41 of the main crimping section 40, and the substrate transporting section 60. The transport of the substrate 3 from the operation section on the upstream side to the operation section on the downstream side in the substrate transporting operation is performed in synchronization between the operation sections.

Furthermore, the control section 2a controls the adhering section 20, changes an orientation and a position (X-Y coordinates) of the substrate 3 held by the substrate moving mechanism 21, changes the interval L1 between the adhering heads 25L and 25R by the head moving motor 27, and performs the adhering operation for adhering the ACF tape T to the substrate 3 by the adhering mechanism 22.

Furthermore, the control section 2a controls the temporary crimping section 30, changes the orientation and the position (X-Y coordinates) of the substrate 3 held by the substrate moving mechanism 31, and temporarily crimps the component 5 supplied from the component supply section 33 onto the substrate 3 by the component mounting mechanism 32. Furthermore, the control section 2a controls the main crimping section 40, changes the orientation and the position (X-Y coordinates) of the substrate 3 held by the substrate moving mechanism 41, and mainly crimps the component 5 that is temporarily crimped onto the substrate 3 by the crimping mechanism 42.

Figure 6:
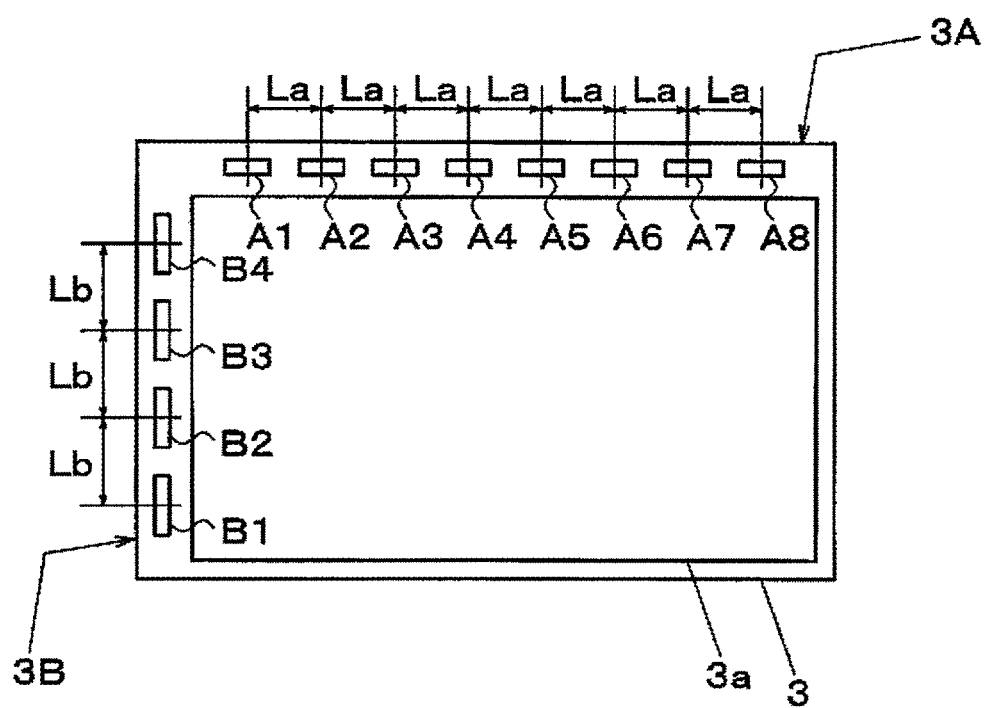
FIG. 6 is a diagram illustrating an example of a substrate on which components are mounted in the component mounting line according to the embodiment of the invention.
Figure 7:
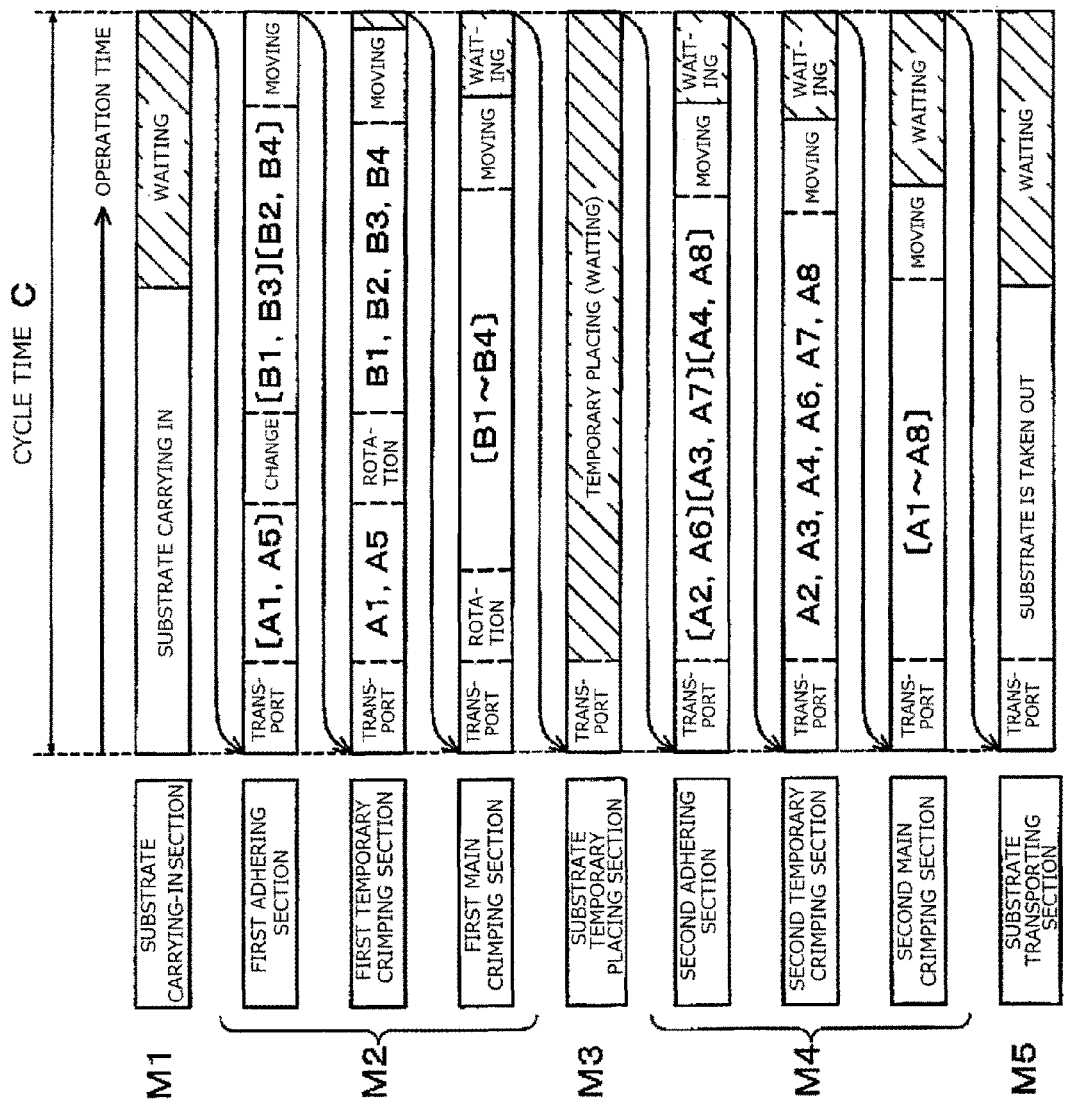
FIG. 7 is a diagram of a flow of a component mounting operation by the component mounting line according to the embodiment of the invention.

The component mounting operation (component mounting method) in the component mounting line 1 will be described with reference to FIGS. 6 to 8. The substrate 3 that is the liquid crystal panel substrate illustrated in FIG. 6 is exemplified with appropriate reference to an operation flow in each operation section illustrated in FIG. 7 and an operation processing situation illustrated in FIG. 8. FIG. 7 illustrates a flow of the component mounting operation in which the substrate 3 before the components are mounted is carried in into the substrate carrying-in section M1, a predetermined operation is performed in each operation section while transporting the substrate 3 between the operation sections, and the substrate 3 after the components are mounted is taken out from the substrate transporting section M5. FIG. 8 illustrates states of the substrate 3 during the operation or after the operation in each operation section.

Hereinafter, for the sake of convenience, the adhering section 20 of the first component mounting device M2 is referred to as "a first adhering section 20A", the temporary crimping section 30 is referred to as "a first temporary crimping section 30A", the main crimping section 40 is referred to as "a first main crimping section 40A", and the substrate transporting section 60 is referred to as "a first substrate transporting section 60A". Similarly, the adhering section 20 of the second component mounting device M4 is referred to as "a second adhering section 20B", the temporary crimping section 30 is referred to as "a second temporary crimping section 30B", the main crimping section 40 is referred to as "a second main crimping section 40B", and the substrate transporting section 60 is referred to as "a second substrate transporting section 60B"

In FIG. 6, a liquid crystal panel 3a is disposed on the surface of the substrate 3. Eight regions A1 to A8 are set in an end portion of a long side 3A (right and left direction in FIG. 6) of the substrate 3 above the liquid crystal panel 3a at an interval La. Four regions B1 to B4 are set in an end portion of a short side 3B (up and down direction in FIG. 6) of the substrate 3 on the left side of the liquid crystal panel 3a at an interval Lb. The component 5 is mounted on each of the regions A1 to A8 and the regions B1 to B4. That is, eight components 5 are mounted on the end portion of the long side 3A and four components 5 are mounted on the end portion of the short side 3B in the substrate 3. The number of the components 5 (electronic components) mounted on the regions A1 to A8 of the long side 3A (one side) is greater than the number of the components 5 mounted on the regions B1 to B4 of the short side 3B (other side).

In FIG. 7, the operations are performed simultaneously and in parallel in the operation sections. The longest operation time of operation times in the operation sections becomes a cycle time C. In the example of FIG. 7, the operation time in the first adhering section 20A becomes the cycle time C. The substrate transporting operation of the substrate 3 between the operation sections is executed in synchronization with the cycle time C. When performing the substrate transporting operation, the substrate 3 is transported between the operation sections in a direction in which the long side 3A is parallel to the X-axis direction (long side 3A is along the substrate transport direction). Moreover, in the operation section in which the operation time is shorter than the cycle time C, the substrate 3 waits for the next substrate transporting operation in a state where the substrate 3 is moved to the "substrate delivery position" of each operation section.

Next, the component mounting operation is described according to an operation flow. First, the substrate 3 before the component is mounted is carried in into the substrate carrying-in section M1 and the substrate 3 waits for the next substrate transporting operation in a state where the substrate 3 is mounted on the substrate mounting stage 11. Next, the substrate 3 is transported to the first adhering section 20A and the ACF tape T (anisotropic conductive member) is adhered to the regions A1 and A5 of a part of the long side 3A (one side), and the regions B1 to B4 of the short side 3B (the other side) of the substrate 3 (ST1: first adhering process) (see FIG. 8). That is, the control section 2a controls the adhering heads 25L and 25R (adhering mechanism 22) to change the interval L1 to four times the interval La of the regions A1 to A8 and thereby simultaneously adhering the ACF tape T to the electrode sections 4 of the region A1 and the region A5 of the long side 3A of the substrate 3.

Next, the substrate 3 is rotated by 90 degrees and the ACF tape T is simultaneously adhered to the electrode sections 4 of the region B1 and the region B3 of the short side 3B of the substrate 3 by the adhering heads 25L and 25R in which the interval L1 is changed to twice the interval Lb of the regions B1 to B4. That is, the control section 2a controls the substrate moving mechanism 21, and the substrate 3 is rotated by 90 degrees and controls the head moving motor 27. Thereby, the interval L1 of the adhering heads 25L and 25R is changed to twice the interval Lb.

Next, the substrate 3 is moved in the X-direction and the ACF tape T is simultaneously adhered to the electrode sections 4 of the region B2 and the region B4. Next, the substrate 3 is moved to the "substrate delivery position". During this period, the interval L1 of the adhering heads 25L and 25R is changed to four times the interval La and the substrate 3 waits for the next adhering operation. As described above, the first component mounting device M2 changes the interval of the plurality of the adhering heads 25L and 25R (adhering units) between the time of adhering the ACF tape T (anisotropic conductive member) to the region A1 and the region A5 of a part of the long side 3A (one side) of the substrate 3 and the time of adhering the ACF tape T (anisotropic conductive member) to the regions B1 to B4 of the short side 3B (the other side).

Next, the substrate 3 is transported to the first temporary crimping section 30A and the components 5 (electronic components) are temporarily crimped onto the region A1 and the region A5 of a part of the long side 3A (one side), and the regions B1 to B4 of the short side 3B (the other side) to which the ACF tape T (anisotropic conductive member) is adhered (ST2: first temporary crimping process) (see FIG. 8). That is, the control section 2a controls the substrate moving mechanism 31, the component mounting mechanism 32, and the component supply section 33. Thereby, the components 5 are temporarily crimped onto the region A1 and the region A5 in order and next, the components 5 are temporarily crimped onto the regions B1 to B4 in order by rotating the substrate 3 by 90 degrees. Next, the substrate 3 is moved to the "substrate delivery position" and waits for the next substrate transporting operation.

Next, the substrate 3 is transported to the first main crimping section 40A and the components 5 (electronic components) that are temporarily crimped onto the regions B1 to B4 of the short side 3B (the other side) is mainly crimped (ST3: first main crimping process) (see FIG. 8). That is, the control section 2a controls the substrate moving mechanism 41 and rotates the substrate 3 by 90 degrees. Furthermore, the control section 2a controls the crimping mechanism 42. Thereby, the components 5 that are temporarily crimped onto the regions B1 to B4 are simultaneously and mainly crimped by four crimping heads 48 in which the interval L2 is set to be the interval Lb of the regions B1 to B4 in advance. Next, the substrate 3 is moved to the "substrate delivery position" and waits for the next substrate transporting operation. Next, the substrate 3 is moved to the substrate temporary placing section M3 and is temporarily placed (waits) for the next substrate transporting operation.

Next, the substrate 3 is transported to the second adhering section 20B and the ACF tape T (anisotropic conductive member) is adhered to remaining regions A2 to A4, and A6 to A8 of the long side 3A (one side) of the substrate 3 (ST4: second adhering process) (see FIG. 8). That is, the control section 2a controls the adhering heads 25L and 25R (the adhering mechanism 22) in which the interval L1 is set to be four times the interval La of the regions A1 to A8. Thereby, the ACF tape T is simultaneously adhered to the electrode sections 4 of the region A2 and the region A6 of the long side 3A of the substrate 3. Next, the ACF tape T is sequentially and simultaneously adhered to combinations of the region A3 and the region A7, and the region A4 and the region A8 of the substrate 3. Next, the substrate 3 is moved to the "substrate delivery position" and waits for the next substrate transporting operation.

Next, the substrate 3 is transported to the second temporary crimping section 30B and the components 5 (electronic components) are temporarily crimped onto the remaining regions A2 to A4, and A6 to A8 of the long side 3A (one side) to which the ACF tape T (anisotropic conductive member) is adhered (ST5: second temporary crimping process) (see FIG. 8). That is, the control section 2a controls the substrate moving mechanism 31, the component mounting mechanism 32, and the component mounting mechanism 32. Thereby, the components 5 are sequentially and temporarily crimped onto the regions A2 to A4, and A6 to A8. Next, the substrate 3 is moved to the "substrate delivery position" and waits for the next substrate transporting operation.

Next, the substrate 3 is transported to the second main crimping section 40B and the components 5 (electronic components) that are temporarily crimped onto the region A1 and the region A5 of a part of the long side 3A (one side) and the components 5 that are temporarily crimped onto the remaining regions A2 to A4, and A6 to A8 of the long side 3A are mainly crimped (ST6: second main crimping process) (see FIG. 8). That is, the control section 2a controls the eight crimping heads 48 in which the interval L2 is set to be the interval La of the regions A1 to A8 in advance and thereby, the components 5 that are temporarily crimped onto the regions A1 to A8 are simultaneously mainly crimped. That is, the second main crimping section 40B is provided with the plurality of crimping heads 48 (main processing means) that mainly crimp the components 5 (electronic components) and the components 5 that are temporarily crimped onto the regions A1 to A8 of the long side 3A (one side) are simultaneously mainly crimped.

Next, the substrate 3 is moved to the "substrate delivery position" and waits for the next substrate transporting operation. Next, the substrate 3 is transported to the substrate transporting section M5. The transported substrate 3 after the components are mounted is transported to the device on the downstream side and the next operation is performed. As described above, in the component mounting line 1, when the substrate 3 before the components are mounted is carried in into the substrate carrying-in section M1, the substrate 3 is transported to the operation section on the downstream side for each cycle time C, the component mounting operation is performed in each operation section, and the substrate 3 after the components are mounted is transported to the substrate transporting section M5.

As described above, the component mounting line 1 in the embodiment is configured such that the first component mounting device M2 on the upstream side and the second component mounting device M4 on the downstream side in which the substrate 3 is transported are connected. The first component mounting device M2 includes the first adhering section 20A that adheres the ACF tape T (anisotropic conductive member) to the region A1 and the region A5 of a part of the long side 3A (one side) and the regions B1 to B4 of the short side 3B (the other side) of the substrate 3, the first temporary crimping section 30A that temporarily crimps the components 5 (electronic components) onto the region A1 and the region A5, and the regions B1 to B4, and the first main crimping section 40A that mainly crimps the components 5 that are temporarily crimped onto the regions B1 to B4. The second component mounting device M4 includes the second adhering section 20B that adheres the ACF tape T to the remaining regions A2 to A4, and A6 to A8 of the long side 3A of the substrate 3, the second temporary crimping section 30B that temporarily crimps the components 5 onto the regions A2 to A4, and A6 to A8, and the second main crimping section 40B that mainly crimps the components 5 that are temporarily crimped onto the regions A1 to A8.

Thus, if the substrate 3, where the number of the components 5 to be mounted thereon is different as eight in the long side 3A and four in the short side 3B, is continuously manufactured, adhering of the ACF tape T to the regions A1 to A8 of the long side 3A and temporary crimping of the components 5 are performed by sharing in the first component mounting device M2 and the second component mounting device M4. Thereby, it is possible to reduce the cycle time C and to improve productivity of the component mounted substrates.

Moreover, distribution of the regions A1 to A8 of the long side 3A to the first component mounting device M2 or the second component mounting device M4 in which the adhering operation and temporary crimping operation are performed is determined as follows by experiment or experience also considering the operation time of the adhering and temporary crimping of the components 5 onto the regions B1 to B4 of the short side 3B. That is, the distribution is performed such that the operation times of the first adhering section 20A and the second adhering section 20B are equal to each other as much as possible, and the operation times of the first temporary crimping section 30A and the second temporary crimping section 30B are equal to each other as much as possible. In brief, if the distribution is performed such that regions combining the regions A1 to A8 and the regions B1 to B4 of the long side 3A and the short side 3B are operated by halves, the operation times are substantially equal to each other.

Above, the embodiment of the invention is described. Those skilled in the related art can understand that, in the embodiment, various modification examples of combinations of each configuration element and each processing process may be provided. and, in addition, the modification examples are also within the scope of the invention.

For example, in the embodiment described above, it is described that the substrate moving mechanism of each operation section rotates in the direction of the holding substrate 3 by 90 degrees. However, since the angle of the substrate 3 to be rotated is determined based on the shape of the substrate 3 and the positions of the plurality of electrode sections 4 provided in the end portion of the substrate 3, the angle to be rotated may be other than 90 degrees.

There are provided the component mounting line and the component mounting method in which productivity of the component mounted substrates can be improved.

What is claimed is:

1. A component mounting line that mounts electronic components on a substrate comprising a one side of the substrate and an other side of the substrate oriented at an angle with respect to the one side of the substrate, the component mounting line comprising:
a first component mounting device on an upstream side in a substrate transporting direction in which the substrate is transported; and
a second component mounting device that is on a downstream side in the substrate transporting direction and is connected with the first component mounting device,
wherein the first component mounting device includes
a first adhering section comprising an adhering head that adheres anisotropic conductive members to a region of a part of the one side of the substrate and a substrate moving mechanism that rotates the substrate such that the adhering head also adheres anisotropic conductive members to a region of the other side of the substrate,
a first temporary crimping section comprising a mounting head that temporarily crimps electronic components onto the region of the part of the one side of the substrate to which the anisotropic conductive members are adhered and a substrate moving mechanism that rotates the substrate such that the mounting head temporarily crimps electronic components onto the region of the other side of the substrate to which the anisotropic conductive members are adhered, and a first main crimping section comprising a crimping head that mainly crimps the electronic components which are temporarily crimped onto the region of the other side of the substrate, and the second component mounting device includes a second adhering section that adheres anisotropic conductive members to remaining regions of the one side of the substrate other than the part of the one side of the substrate to which the anisotropic conductive members where adhered to in the first adhering section, a second temporary crimping section that temporarily crimps electronic components onto the remaining regions of the one side of the substrate to which the anisotropic conductive members are adhered to in the second adhering section, and a second main crimping section that mainly crimps the electronic components which are temporarily crimped onto the region of the part of the one side of the substrate and the electronic components which are temporarily crimped onto the remaining regions of the one side of the substrate.

2. The component mounting line according to claim 1, wherein the first adhering section is provided with a plurality of adhering units that adhere the anisotropic conductive members at predetermined intervals and the intervals of the plurality of adhering units are variable.

3. The component mounting line according to claim 1, wherein the second main crimping section is provided with a plurality of main crimping units that mainly crimps the electronic components and the plurality of main crimping units simultaneously mainly crimp the electronic components which are temporarily crimped onto the region of the one side of the substrate.

4. The component mounting line according to claim 1, wherein the first component mounting device and the second component mounting device are configured such that the number of the electronic components to be mounted on the region of the one side of the substrate is greater than the number of the electronic components to be mounted on the region of the other side of the substrate.

5. A component mounting method for mounting electronic components on a substrate in a component mounting line comprising a first component mounting device on an upstream side in a substrate transporting direction in which the substrate comprising a one side of the substrate and an other side of the substrate oriented at an angle with respect to the one side of the substrate is transported and a second component mounting device that is on a downstream side in the substrate transporting direction and is connected with the first component mounting device, the method comprising:

in the first component mounting device, adhering anisotropic conductive members to a region of a part of the one side of the substrate and a region of the other side of the substrate, temporarily crimping the electronic components onto the region of the part of the one side of the substrate and the region of the other side of the substrate to which the anisotropic conductive members are adhered, and mainly crimping the electronic components which are temporarily crimped onto the region of the other side of the substrate, and in the second component mounting device, adhering the anisotropic conductive members to remaining regions of the one side of the substrate other than the part of the one side of the substrate to which the anisotropic conductive members where adhered to in the first component mounting device, temporarily crimping the electronic components onto the remaining regions of the one side of the substrate to which the anisotropic conductive members are adhered, and mainly crimping the electronic components which are temporarily crimped onto the region of the part of the one side of the substrate and the electronic components which are temporarily crimped onto the remaining regions of the one side of the substrate.

6. The component mounting method according to claim 5, wherein the first component mounting device is provided with a plurality of adhering units that adhere the anisotropic conductive members at predetermined intervals and the intervals of the plurality of adhering units are variable, and the first component mounting device changes the intervals of the plurality of adhering units in a time period between a time of adhering the anisotropic conductive members to the region of the part of the one side of the substrate and a time of adhering the anisotropic conductive members to the region of the other side of the substrate.

7. The component mounting method according to claim 5, wherein the electronic components which are temporarily crimped onto the region of the one side of the substrate are simultaneously mainly crimped in the second component mounting device.

8. The component mounting method according to claim 5, wherein the number of the electronic components to be mounted on the region of the one side of the substrate is greater than the number of the electronic components to be mounted on the region of the other side of the substrate.

* * * * *